US009237184B2

(12) United States Patent
Kang et al.

(10) Patent No.: US 9,237,184 B2
(45) Date of Patent: *Jan. 12, 2016

(54) WEB BASED SMART SENSOR NETWORK TRACKING AND MONITORING SYSTEM

(71) Applicant: STMicroelectronics, Inc., Coppell, TX (US)

(72) Inventors: Bo Kang, Union City, CA (US); Jianjian Huo, San Jose, CA (US)

(73) Assignee: STMicroelectronics, Inc., Coppell, TX (US)

( * ) Notice: Subject to any disclaimer, the term of this patent is extended or adjusted under 35 U.S.C. 154(b) by 64 days.

This patent is subject to a terminal disclaimer.

(21) Appl. No.: 14/078,045

(22) Filed: Nov. 12, 2013

(65) Prior Publication Data

US 2014/0074979 A1 Mar. 13, 2014

Related U.S. Application Data

(63) Continuation of application No. 12/568,528, filed on Sep. 28, 2009, now Pat. No. 8,665,784.

(60) Provisional application No. 61/101,007, filed on Sep. 29, 2008.

(51) Int. Cl.
  *H04L 29/08* (2006.01)
  *H04L 12/24* (2006.01)
  *G01R 21/133* (2006.01)
  *G01R 19/22* (2006.01)

(52) U.S. Cl.
  CPC .............. *H04L 67/025* (2013.01); *G01R 19/22* (2013.01); *G01R 21/133* (2013.01); *H04L 41/32* (2013.01)

(58) Field of Classification Search
  CPC ...... H04L 61/125; H04L 61/025; H04L 41/32; H04W 34/18
  USPC .......................................... 370/328, 318, 336
  See application file for complete search history.

(56) References Cited

U.S. PATENT DOCUMENTS

| 7,043,393 | B2 | 5/2006 | Fuller, III et al. |
| 7,526,535 | B2 | 4/2009 | Peck et al. |
| 2001/0013826 | A1 | 8/2001 | Ahmed et al. |
| 2002/0095619 | A1 | 7/2002 | Marsh |

(Continued)

OTHER PUBLICATIONS

Harish Ramamurthy, B. S. Prabhu, Rajit Gadh, and Asad M. Madni, "Wireless Industrial Monitoring and Control using a Smart Sensor Platform", Wireless Internet for the Mobile Enterprise Consortium, University of California, Los Angeles, BEI Technologies, Inc., Sylmar, California, No Date, 9 pps.

*Primary Examiner* — Rasheed Gidado
(74) *Attorney, Agent, or Firm* — Gardere Wynne Sewell LLP

(57) ABSTRACT

A wireless sensor network including a plurality of Smart Sensors coupled to a wide area network such as the Internet via a Wireless Sensor Coordinator. Each wireless sensor network comprises a plurality of Smart Sensors, each operable to measure one or more physical quantities. Each wireless sensor communicates the measured data to a Wireless Sensor Coordinator which then stores the collected data in memory. The Wireless Sensor Coordinator further includes a web server operable to post a web site on a network that is accessible by a common web browser. Upon receiving a request for sensed data via the web site, the Wireless Sensor Coordinator retrieves the appropriate measured and stored data and converts it into HTML format pages which are then posted on the web site for review by the requestor.

17 Claims, 5 Drawing Sheets

(56) References Cited

U.S. PATENT DOCUMENTS

| | | |
|---|---|---|
| 2005/0254505 A1 | 11/2005 | Chang et al. |
| 2006/0250980 A1 | 11/2006 | Pereira et al. |
| 2007/0194913 A1* | 8/2007 | Yokoshima et al. ..... 340/539.26 |
| 2007/0239862 A1 | 10/2007 | Bronez et al. |
| 2007/0262863 A1* | 11/2007 | Aritsuka et al. ......... 340/539.22 |
| 2007/0266117 A1 | 11/2007 | Pomies et al. |
| 2007/0282944 A1* | 12/2007 | Odaka et al. .................. 709/203 |
| 2008/0140979 A1 | 6/2008 | Kim et al. |
| 2008/0205317 A1 | 8/2008 | Piipponen et al. |
| 2008/0297373 A1* | 12/2008 | Hayakawa et al. ...... 340/870.39 |
| 2009/0022078 A1 | 1/2009 | Patterson et al. |

* cited by examiner

WEB BASED SMART SENSOR NETWORK TRACKING AND MONITORING SYSTEM

RELATED APPLICATION

This application is a continuation of and claims the benefit of U.S. patent application Ser. No. 12/568,528 filed Sep. 28, 2009 and claims the benefit of U.S. Provisional Application No. 61/101,007 filed Sep. 29, 2008. The disclosure of the foregoing United States Patent Application is specifically incorporated herein by this reference.

BACKGROUND OF THE INVENTION

1. Field of the Invention

Embodiments of the present invention relate, in general, to data collection, processing, and dissemination in a wireless network and more particularly to tracking and monitoring of a web based Smart Sensor network.

2. Relevant Background

Wireless sensor networks consisting of large numbers of inexpensive and energy-constrained devices are an emerging area of networking research. Wireless sensor networks are expected to find a wide range of applications including target tracking, habitat monitoring, and disaster relief. Applications typically involve sensing in harsh and inhospitable terrains; wireless sensor networks can consist of large numbers of wireless devices, each capable to some degree of sensing, processing, and communicating. Together, the wireless devices self-configure into a network without any existing infrastructure, and cooperatively sense, process, and disseminate information to a user of the network.

Despite the versatility of such a self-configuring wireless network, data collected by the wireless sensors cannot be easily accessed. Protocol and bandwidth limitations make the retrieval of data an arduous task. A common web server as would be known to one skilled in the art is too large to reside embedded in a wireless sensor network. Such networks are characterized by limited memory and low computational performance. Thus, while wireless sensing networks offer a great deal of potential, much of their advantages have yet to be realized.

Moreover, messages relayed through a wireless sensor network are generally not reliable and they possess latencies which often discount the value of the information contained within the message.

Most prior art wireless network systems utilize a proprietary software based network tracking and monitoring system. Such a system requires each user to install complex application software at each local drive in order to access sensor activity and sensor data. Due to the diversity of operating systems, computers, and communication protocols, the development of a proprietary based system limits its applicability and results in multiple versions of software. This multiplicity of proprietary software increases the cost of the product and makes its implementation inconvenient. It also limits a user's ability to access sensor data as data access can only occur using a particular hardware resource or platform.

In addition, the evolution of a proprietary based sensor system has led to proprietary communication protocols between the Smart Sensor network and the user software. This, too, leads to less efficient messaging that is incapable of providing any sort of real-time messaging. A need therefore exists to readily access sensor data which is both reliable and real-time based. These and other deficiencies of the prior art are addressed by one or more embodiments of the present invention.

SUMMARY OF THE INVENTION

A web based Smart Sensor network monitoring and tracking system is hereafter described by way of example. According to one embodiment of the present invention a wireless sensor network is formed that includes at least one wireless sensor operable to measure one or more physical quantities. These physical quantities can include temperature, humidity, vibration, noise, wind speed, location, and any other environmental or physical attribute that can be physically measured. Each sensor includes, among other things, a wireless communication stack operable to wirelessly communicate the one or more physical quantities measured by the at least one sensor to a wireless network coordinator. The wireless network coordinator is operable to receive and store the one or more physical quantities measured by the sensor within the wireless sensor network.

The coordinator is interposed between the wireless sensor network and a wide area network such as the Internet or the like. In addition to being able to communicate with each of the wireless sensors, the coordinator also is communicatively coupled to the wide area network using, according to one embodiment of the present invention, TCP/IP protocols. Upon receiving a request via the wide area network for access to one or more of the physical quantities measured by one of the sensors in the wireless sensor network, the coordinator accesses the measured physical quantity and converts the one or more physical quantities measured by the at least one sensor to a HTML web page which is thereafter posted on the coordinator's web site. From there the information, the physical measurement of the wireless sensor, can be accessed by any web browser.

According to another embodiment of the present invention, a Wireless Sensor Coordinator is interposed between a network of wireless sensors and a wide area network. The Wireless Sensor Coordinator includes a communication stack operable for communicating with each of the one or more wireless sensors with which it shares association. Each wireless sensor within the wireless sensor network is operable for measuring one or more physical quantities such as wind speed, temperature, humidity, seismic activity, location, etc. These measured quantities, data, are wirelessly communicated back to the Wireless Sensor Coordinator where they are stored, at the coordinator, in memory.

The Wireless Sensor Coordinator also includes a network communication stack which communicatively couples the Wireless Sensor Coordinator to a wide area network. This network can be an Intranet or the Internet depending on the implementation of the present invention. The Wireless Sensor Coordinator further comprises an embedded web server having a common gateway interface. Using the web server and common gateway interface scripts, the physical quantities measured by the sensors and stored on the coordinator are, upon request, converted from the stored physical quantity measurements into HTML format. Thereafter the physical quantities measured by the wireless sensors can be accessed in an HTML format via the coordinator's web site on the wide area network using a web browser.

Another embodiment of the present invention includes a method for dynamically accessing wireless sensor data of a wireless sensor network. According to the present invention a user accesses a web site of a wireless sensor network coordinator via a web browser. Once in communication with the coordinator, a user may request a physical quantity measured by one or more wireless sensors which are associated with the Wireless Sensor Coordinator. Upon receiving a request for physical quantities measured by one or more of the sensors of the coordinator's wireless sensor network, the Wireless Sensor Coordinator accesses the requested physical quantity measured by the wireless sensor and converts it to HTML format. Once converted the HTML rendering of the physical quantity is conveyed to the web browser via, in one embodiment, TCP/IP protocols.

The features and advantages described in this disclosure and in the following detailed description are not all-inclusive. Many additional features and advantages will be apparent to one of ordinary skill in the relevant art in view of the drawings, specification, and claims hereof. Moreover, it should be noted that the language used in the specification has been principally selected for readability and instructional purposes and may not have been selected to delineate or circumscribe the inventive subject matter; reference to the claims is necessary to determine such inventive subject matter.

BRIEF DESCRIPTION OF THE DRAWINGS

The aforementioned and other features and objects of the present invention and the manner of attaining them will become more apparent, and the invention itself will be best understood, by reference to the following description of one or more embodiments taken in conjunction with the accompanying drawings, wherein.

Figure 1:
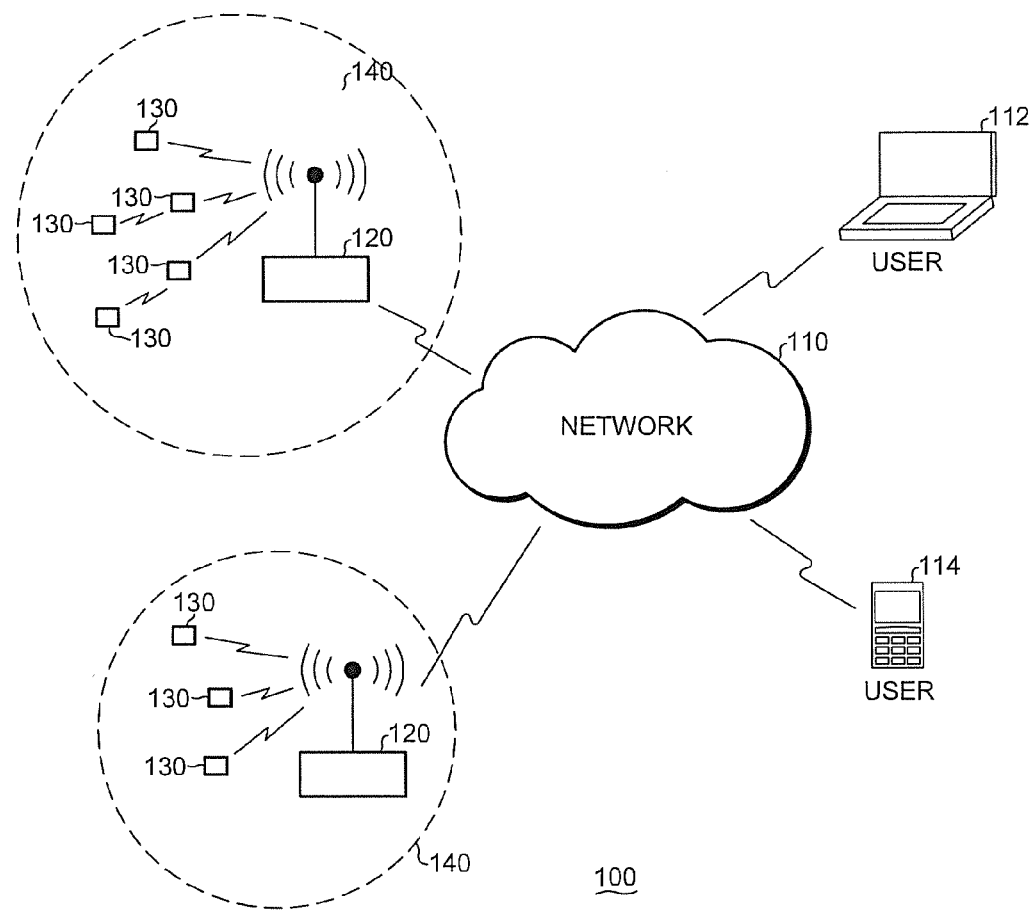
FIG. 1 shows a network environment having at least one wireless sensor networked communicatively coupled to a web based access device, according to one embodiment of the present invention.

The Figures depict embodiments of the present invention for purposes of illustration only. One skilled in the art will readily recognize from the following discussion that alternative embodiments of the structures and methods illustrated herein may be employed without departing from the principles of the invention described herein.

GLOSSARY AND ACRONYMS

As a convenience in describing the invention herein, the following glossary of terms is provided. Because of the introductory and summary nature of this glossary, these terms must also be interpreted more precisely by the context of the Detailed Description in which they are discussed.

HTML (HyperText Markup Language) is a markup language that is used to create documents on the World Wide Web incorporating text, graphics, sound, video, and hyperlinks. HTML provides a means to describe the structure of text-based information in a document by denoting certain text as links, headings, paragraphs, lists, and the like and to supplement that text with interactive forms, embedded images, and other objects.

HTTP (HyperText Transfer Protocol) is a communications protocol for the transfer of information on the Internet or a similar wide area network. HTTP is a request/response standard between a client and a server. A client is the end-user; the server is the web site. The client making a HTTP request—using a web browser, spider, or other end-user tool—is referred to as the user agent. The responding serve—which stores or creates resources such as HTML files and images—is called the origin server. In between the user agent and origin server may be several intermediaries, such as proxies, gateways, and tunnels. HTTP is not constrained to using TCP/IP and its supporting layers, although this is its most popular application on the Internet.

A Web Server is a computer housing a computer program that is responsible for accepting HTTP requests from web clients, which are known as web browsers, and serving them HTTP responses along with optional data contents, which usually are web pages such as HTML documents and linked objects (images, etc.).

ZigBee is a specification for a suite of high level communication protocols using small, low-power digital radios based on the IEEE 802.15.4-2003 standard for wireless personal area networks, such as wireless headphones connecting with cell phones via short-range radio. The technology defined by the ZigBee specification is intended to be simpler and less expensive than other WPANs, such as Bluetooth. ZigBee is targeted at radio-frequency applications that require a low data rate, long battery life, and secure networking.

The Internet Protocol Suite (commonly known as TCP/IP) is the set of communications protocols used for the Internet and other similar networks. It is named from two of the most important protocols in it: the Transmission Control Protocol (TCP) and the Internet Protocol (IP), which were the first two networking protocols defined in this standard. Today's IP networking represents a synthesis of several developments that began to evolve in the 1960s and 1970s, namely the Internet and LANs (Local Area Networks), which emerged in the mid- to late-1980s, together with the advent of the World Wide Web in the early 1990s. The Internet Protocol Suite, like many protocol suites, may be viewed as a set of layers. Each layer solves a set of problems involving the transmission of data, and provides a well-defined service to the upper layer protocols based on using services from some lower layers. Upper layers are logically closer to the user and deal with more abstract data, relying on lower layer protocols to translate data into forms that can eventually be physically transmitted. The TCP/IP model consists of four layers (RFC 1122). From lowest to highest, these are the Link Layer, the Internet Layer, the Transport Layer, and the Application Layer.

The Internet is a global system of interconnected computer networks that use the standardized Internet Protocol Suite, serving billions of users worldwide. It is a network of networks that consists of millions of private, public, academic, business, and government networks of local to global scope that are linked by copper wires, fiber-optic cables, wireless connections, and other technologies. The Internet carries a vast array of information resources and services, most notably the inter-linked hypertext documents of the World Wide Web and the infrastructure to support electronic mail. In addition it supports popular services such as online chat, file transfer and file sharing, gaming, commerce, social networking, publishing, video on demand, and teleconferencing and telecommunications.

The World Wide Web is a system of interlinked hypertext documents accessed via the Internet. With a web browser, one can view Web pages that may contain text, images, videos, and other multimedia and navigate between them using hyperlinks.

Wireless communication is the transfer of information over a distance without the use of electrical conductors or "wires". The distances involved may be short (a few meters as in television remote control) or long (thousands or millions of kilometers for radio communications). When the context is clear, the term is often shortened to "wireless". Wireless communication is generally considered to be a branch of telecommunications.

A Sensor is a device that measures a physical quantity and converts it into a signal which can be read by an observer or by an instrument.

A Smart Sensor is a system that measures one or more physical quantities and converts them to the signals which can be directly monitored, processed by an embedded microprocessor. In addition to one or more sensors, a Smart Sensor is typically equipped with a radio transceiver or other wireless communications device, a small microcontroller, and an energy source, usually a battery. A Smart Sensor can also be referred to as a Smart Sensor node. A Smart Sensor can also be considered for the purposes of the present invention as a system that measures one or more physical quantities, monitoring exceptional events, and makes the measurement data and function available to Wireless Sensor Networks through standard or customizable communication protocol.

A Wireless Sensor Network ("WSN"), also referred to herein as a sensor cell, is a wireless network consisting of spatially distributed autonomous devices using sensors to cooperatively monitor physical or environmental conditions, such as temperature, sound, vibration, pressure, motion or pollutants, at different locations. A Wireless Sensor Network normally constitutes a wireless ad-hoc network, meaning that each sensor supports a multi-hop routing algorithm (several nodes may forward data packets to the coordinator).

A Wireless Sensor Coordinator is a system that is used to manage Smart Sensors in a Wireless Sensor Network. The coordinator collects sensor data from Smart Sensors and acts as a gateway to connect each sensor to a wide area network such as the Internet.

The Sensor Web is a type of sensor network or geographic information system (GIS) connected to the Internet (or "World Wide Web" or "WWW") which is especially well suited for environmental monitoring, tracking and control. A Sensor Web may comprise a plurality of Wireless Sensor Networks.

A Router is a networking device whose software and hardware are usually tailored to the tasks of routing and forwarding information. For example, on the Internet, information is directed to various paths by routers.

A Web Site (also written as website or web-site) is a collection of related webpages (or web pages), images, videos or other digital assets that are addressed with a common domain name or IP address in an Internet Protocol-based network. A web site is hosted on at least one web server, accessible via the Internet or a private local area network.

Multithreading computers are computers that have hardware support to efficiently execute multiple threads of data. These are distinguished from multiprocessing systems (such as multi-core systems) in that the threads have to share the resources of single core: the computing units, the central processing unit, caches and the translation lookaside buffer. Where multiprocessing systems include multiple complete processing units, multithreading aims to increase utilization of a single core by leveraging thread-level as well as instruction-level parallelism.

DESCRIPTION OF THE INVENTION

Embodiments of the present invention are hereafter described in detail with reference to the accompanying Figures. To the extent possible, numerals identifying particular aspects of the present invention are used consistently throughout the Figures to prevent confusion and duplication. Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention.

A wireless Smart Sensor network that is dynamically accessible by any web browser via a wide area network such as the Internet is hereafter disclosed by way of example. As is well known to one skilled in the relevant art, communications within existing (prior) wireless sensor networks are proprietary in nature making access to the measurements collected by the sensors arduous at best. The present invention teaches a means by which to access physical quantity measurements by way of a common web browser. By interposing a Wireless Sensor Coordinator between one or more wireless sensor networks and a communication network such as a wide area network, dynamic access to the measured quantities can be obtained reliably and quickly.

According to one embodiment of the present invention, a web server is embedded in a Wireless Sensor Coordinator. The coordinator possesses both the means by which to communicate with each wireless sensor so as to collect the sensor's measured quantities and the ability to communicatively couple with a wide area communications network such as the Internet. Furthermore, the web server can convert the measured sensor quantities into a HTML format that can then be accessed via a conventional web site using a common web browser.

FIG. 1 shows a network environment in which a Smart Sensor wireless network, according to the present invention, can be implemented. As seen in FIG. 1 the network environment 100 includes two Smart Sensor wireless networks 140 that are each communicatively coupled to a larger more robust network 110. This centralized network, in one embodiment, can be a wide area network such as the Internet. In other implementations of the present invention the central communicative network 110 can be an Intranet, local area network or similar networking infrastructure.

In the embodiment shown in FIG. 1 the central network 110 links both sensor networks 140 to one or more user devices 112/114. In one instance a user is accessing the network 110 via a laptop computer 112 while in the other rendition a user is using a personal communication device such as a digital assistant or cellular telephone 114 to access information conveyed by the network 110. As will be discussed later, the present invention allows a user to access information gained by one or more sensors within a sensor network by using a common web browser to access the sensor network's web site on the network 110.

Each of the two wireless sensor networks 140 includes a plurality of wireless sensors 130 that are communicatively linked to a Wireless Sensor Coordinator 120. The Wireless Sensor Coordinator is thereafter communicatively coupled, either wirelessly or via a hard line, to the network 110.

As was previously mentioned, wireless sensor networks have broad applications and are of growing interest in many fields of endeavor. For example, proprietary wireless sensor systems are used in automobiles to monitor and track the performance of multiple aspects of a vehicle's performance. The information collected by a plurality of sensors is relayed via a proprietary protocol and/or device to a processing unit for analysis and, in some cases, communicated to a central host for overall fleet management.

The range of applications in which wireless sensor networks can be employed is vast. The webs laid by the wireless sensors can span miles and, due to their low power requirements, run continuously for years. They can also be fielded in extremely harsh environments such as deserts, mountains, snow packs, and even Antarctica while still conveying accurate and reliable data. Beyond the collection of atmospheric measurement, sensor arrays can be used for battlefield surveillance so as to identify troop movement. Urban settings can use a sensor grid for search and rescue and homeland security infrastructure protection. Certainly the transportation grid can use a series of sensors to track movement of autos, trains, and vessels. Finally, Smart Sensor networks also have applications in the home and workplace to monitor movement, control heating and cooling, run audio visual applications, and so forth. Thus the applications for sensor networks are broad but the ability to gain information from each of these typically proprietary networks has been historically difficult. Indeed the lynch pin to these networks has always been the ability to quickly and reliably access the data.

According to one embodiment of the present invention, a Wireless Sensor Coordinator is interposed between a wireless sensor network and a communication network such as the Internet. The coordinator receives and stores physical quantities measured by each of the wireless sensors and, when requested, conveys the information to a user on the area network via a web site in HTML format.

Figure 2:
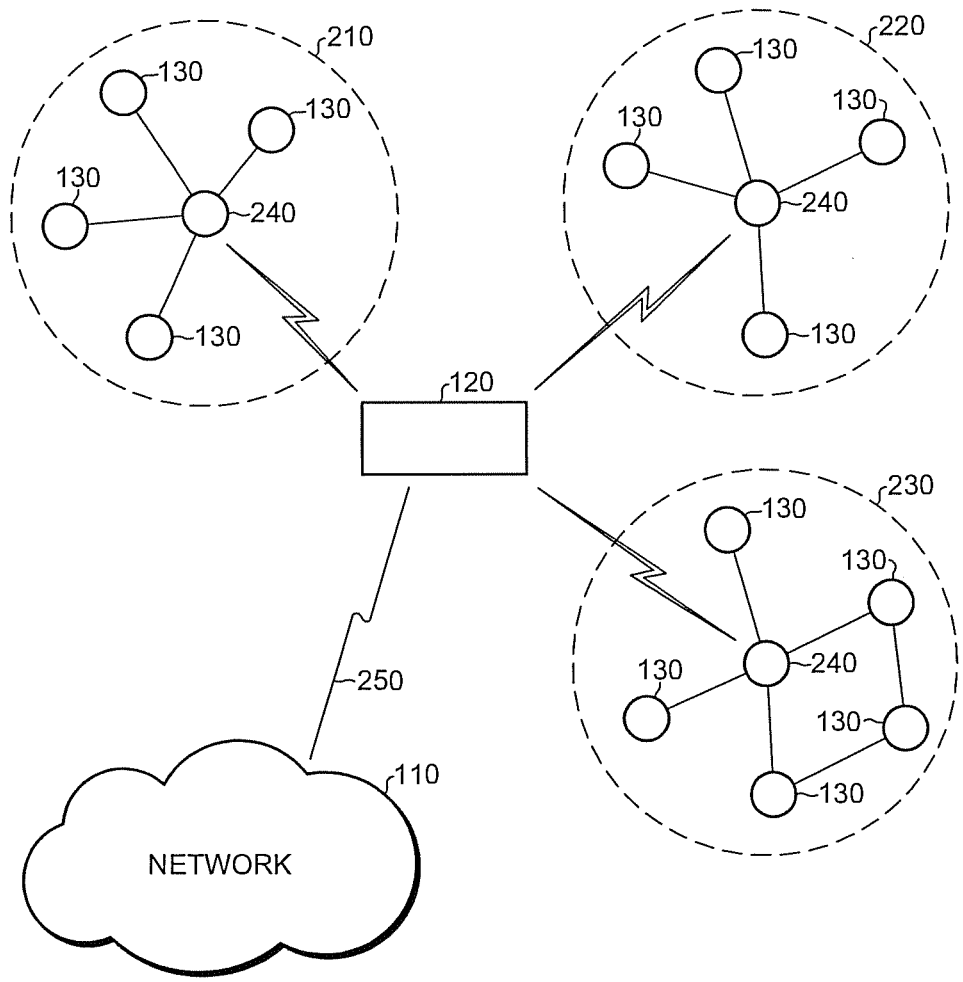
FIG. 2 shows one embodiment of a plurality of wireless sensors interfacing with a network environment via a Wireless Sensor Coordinator, according to the present invention.

FIG. 2 shows a high level rendition of a wireless sensor network arrangement according to one embodiment of the present invention. In the embodiment shown in FIG. 2, three separate Smart Sensor wireless networks are communicatively linked to a wide area network 110 via a Wireless Sensor Coordinator 120. Each wireless network cell 210, 220, 230 is organized into a plurality of wireless sensors 120 and, in this case, a central router 240. The router 240 is further communicatively linked to the Wireless Sensor Coordinator. This "two level" topology allows the wireless sensor to meet real-time requirements.

An important aspect of a wireless sensor network is its ability to provide vital data on a real-time basis. During certain periods a coordinator 120 that is responsible for a plurality of sensors in a single level hierarchy may be overloaded with data and thus be unable to meet real-time data collection and retrieval demands. The wireless sensor network of the present invention comprises spatially distributed autonomous devices that cooperatively monitor and measure physical or environmental conditions. The wireless sensor network is an ad-hoc network meaning that each sensor supports multi-hop routing; several nodes or sensors within a network may forward data collected by one sensor to the coordinator.

To overcome this dilemma one embodiment of the present invention interposes a router 240 between a select plurality of wireless sensors 130 and a central wireless sensor coordinator 120. As can be seen in FIG. 2, a wireless sensor 130 sends its measured physical quantity to the router 240. The router 240 then passes the information to the coordinator 120. One aspect of the router is to prioritize the incoming data and, if necessary, resolve collisions in data between multiple wireless sensors 130. In that way the coordinator 120 is able to effectively retrieve from each sensor cell the most accurate and highest priority data.

As one skilled in the relevant art will appreciate, the sensor cells 210, 220, 230 may each possess hundreds of wireless sensors in an overlapping configuration. And each cell may be designed to retrieve a specific physical quantity. For example one cell 210 may be designed to measure seismic activity within the proximity of the sensor. Another cell 220 may be designed to measure sound, while the third cell 230 may possess sensors designed to measure temperature and other atmospheric quantities. As each sensor measures a quantity it conveys it to the router 240. While some cells, such as the atmospheric sensor array, periodically measure data, another cell, say the seismic activity sensor array 210, is only active when seismic activity triggers activation. The router 240 assists in managing the measured quantities so that real-time demands/requests presented to the coordinator 120 can be achieved.

Figure 3:
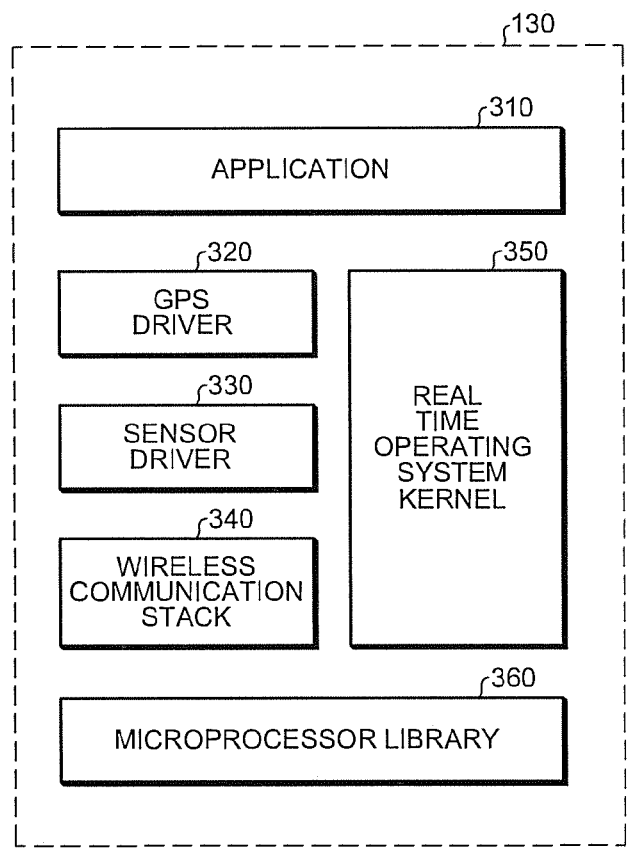
FIG. 3 is a high level functional block diagram of one embodiment of a wireless sensor according to the present invention.

FIG. 3 is a high level functional block diagram of a wireless sensor, as utilized in a wireless sensor network, according to one embodiment of the present invention. Each Smart Sensor 130 includes application instructions 310 and hardware pertinent to the physical quantity it is designed to measure. For example, a sensor designed to measure temperature may include a thermocouple and associated firmware/software, while one designed to measure vibrations may include a strain gauge array oriented to pick up local vibrations. Associated with each application 310 are sensor drivers 330 and a global positing satellite (GPS) driver 320. While some sensors may not utilize GPS to determine the location of the sensor, some sort of location identification means is typically included in each sensor so that the senor array can self-configure into a network. Furthermore the physical quantity measured by the sensor is likely of little use without knowing the location of that measurement. Each Smart Sensor 130 also includes a radio transceiver or other wireless communication device, a small microcontroller and a power source of some sort, typically a battery. In some embodiments a wireless sensor is also referred to as a sensor node or Smart Sensor node.

The sensor also includes a wireless communication stack 340 and a real-time operating system (RTOS) kernel. The RTOS kernel is included in the Smart Sensor from a system point of view as most wireless communications are multi-threaded. Recall that multi-threading computers have hardware support to efficiently execute multiple threads that have to share the resources of single core. Where multiprocessing systems include multiple complete processing units, multi-threading aims to increase utilization of a single core by leveraging thread-level as well as instruction-level parallelism.

The Smart Sensor also includes a microprocessor firmware library 360 that is used to operate microprocessor computing resources and peripheral resources required for the operation of the Smart Sensor. The Smart Sensor, through the wireless communication stack, can communicate with a Wireless Sensor Coordinator or other Smart Sensors within a Smart Sensor Wireless Network.

A router, as described with respect to FIG. 2, is a Smart Sensor with additional application software and drivers. While maintaining its ability to act as a Smart Sensor, the router has the additional functionality to manage incoming messages and act as a gateway to the Wireless Sensor Coordinator.

Figure 4:
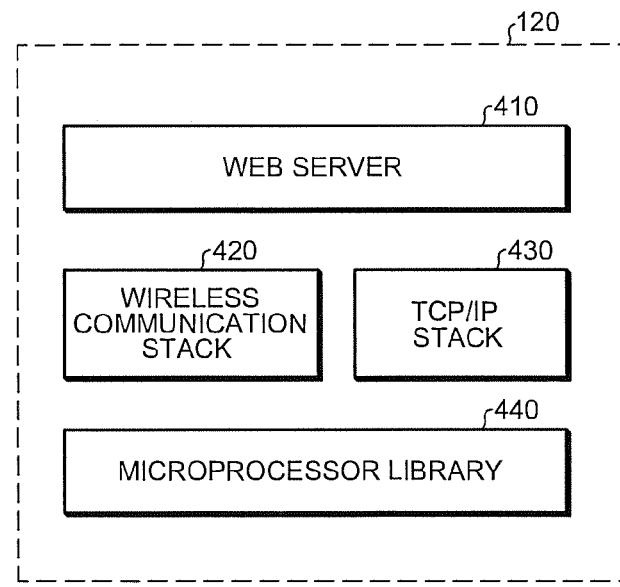
FIG. 4 is a high level functional block diagram of one embodiment of a Wireless Sensor Coordinator according to the present invention.

A Wireless Sensor Coordinator 120 plays a key role in dealing with requests for sensor data from a user. FIG. 4 is a high level functional block diagram of a Wireless Sensor Coordinator according to one embodiment of the present invention. As with the Smart Sensor 130, the Wireless Sensor Coordinator 120 includes a microprocessor library that is used to operate microprocessor computing resources and peripheral resources required for the operation of the coordinator.

The coordinator 120 also includes a wireless communication stack 420 much like that of the Smart Sensor 130 that allows the coordinator to communicate with each Smart Sensor 130 within its network of responsibility or, in another embodiment, with one or more routers. In addition to the wireless communication stack 420 each coordinator 120 includes a TCP/IP, or similar, network communication stack 430 and a web server 410. The web server 410 and the TCP/IP stack 430 reside within each coordinator and play a key role in managing and responding to user requests for sensor data.

Through the web server 410 and TCP/IP stack 430 each coordinator produces a web site accessible via the Internet 110. Using a common web browser a user on the Internet 110 can access the web site and convey a request for sensor measurements associated with a particular coordinator 120/wireless sensor network. Each coordinator includes a memory resource operable to store quantities measured by each of the sensors 130 within its wireless sensor network. When a sensor makes a measurement, that measurement is immediately conveyed to the coordinator where it is stored.

Upon receiving a request from a user on the coordinator's web site, the web server 410 identifies and accesses the requested measured quantity and converts the measurements (sensor data) into HTML format pages. Once converted the HTML format pages of the requested measured sensor data is posted via HTTP and TCP/IP protocols on the coordinator web site for viewing by the user.

As can be appreciated by one skilled in the relevant art, the actual configuration of the Smart Sensor and Wireless Sensor Coordinator can vary without departing from the scope and spirit of the present invention. One embodiment of the present invention used to validate concepts presented herein uses a ZigBee and RTOS combination. ZigBee is a low cost, low power, wireless mesh networking standard that allows its technology to be widely deployed in wireless control and monitoring applications. The low power requirements allow for longer life of the sensor array with smaller batteries and mesh networking provides highly reliable data collection.

The coordinator's role of converting the measured physical quantities from each of the wireless sensors into HTML format pages can, according to one embodiment of the present invention, be accomplished by processing Common Gateway Interface (CGI) scripts. By executing the CGI scripts in the coordinator's web server, sensor data from web pages can be accessed dynamically. Data exchanges between the end user and the coordinator can adopt a user datagram protocol to transfer normal sensor data using less communication overhead; important or exceptional events can utilize TCP/IP protocols. To better understand the architecture of both the Smart Sensor and the Wireless Sensor Coordinator consider the measuring and accessing of physical quantities according to the present invention.

Figure 5:
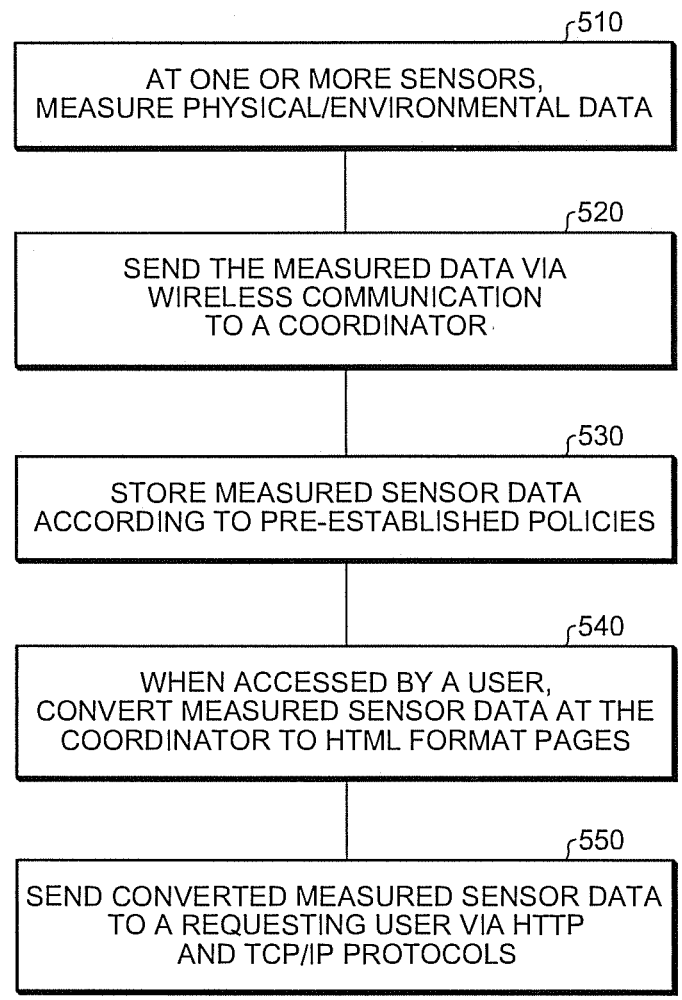
FIG. 5 is one method embodiment for measuring and communicating physical quantities collected by a wireless sensor to a requesting user according to the present invention.
Figure 6:
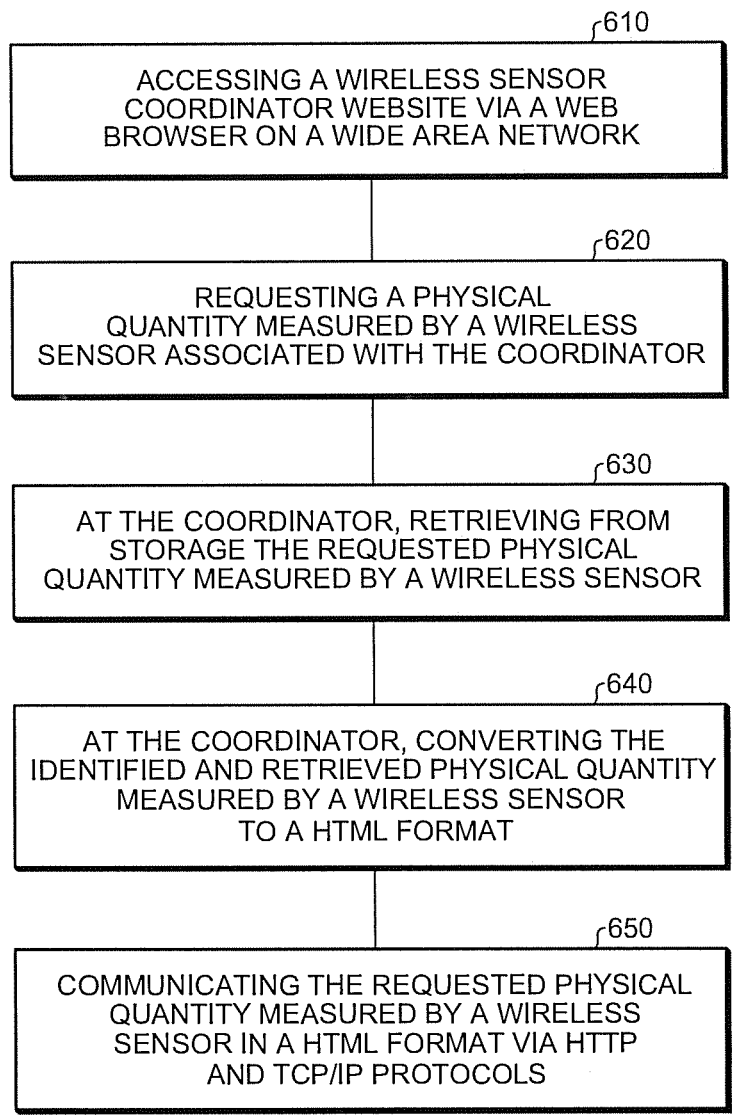
FIG. 6 is one method embodiment of a process for dynamically accessing physical quantities measured by a wireless sensor of a wireless sensor network using a HTML format over a wide area network.

FIGS. 5 and 6 depict flowcharts for a method to measure/collect physical quantities using a wireless Smart Sensor network and for access to such gained data using a common web browser, according to the present invention. In the following description, it will be understood that each block of the flowchart illustrations, and combinations of blocks in the flowchart illustrations, can be implemented by computer program instructions. These computer program instructions may be loaded onto a computer or other programmable apparatus to produce a machine such that the instructions that execute on the computer or other programmable apparatus create means for implementing the functions specified in the flowchart block or blocks. These computer program instructions may also be stored in a computer-readable memory that can direct a computer or other programmable apparatus to function in a particular manner such that the instructions stored in the computer-readable memory produce an article of manufacture including instruction means that implement the function specified in the flowchart block or blocks. The computer program instructions may also be loaded onto a computer or other programmable apparatus to cause a series of operational steps to be performed in the computer or on the other programmable apparatus to produce a computer implemented process such that the instructions that execute on the computer or other programmable apparatus provide steps for implementing the functions specified in the flowchart block or blocks.

Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware-based computer systems that perform the specified functions or steps, or combinations of special purpose hardware and computer instructions.

FIG. 5 is a method flowchart for the measuring and collection of physical quantities using a wireless Smart Sensor network. The process begins after the network has been configured and each Smart Sensor is in communication with one another. At one or more sensors within the network, a physical quantity such as temperature, humidity, pressure, etc. is measured 510. As will be appreciated by one skilled in the art, the actual measurement of the physical quantity is dependent on the type and configuration of the Smart Sensor. Each sensor possesses sensors and sensor drivers that are implemented by an application resident on the sensor. The measurement may be taken periodically, scheduled, or may be event driven.

Once a physical quantity has been measured, the Smart Sensor transmits 520 the collected data to a coordinator. As previously discussed each Smart Sensor operates autonomously and possesses limited processing and memory capability. The data measured by the sensor is immediately conveyed to the coordinator for storage and further processing.

According to another embodiment of the present invention, physical measurements taken by a Smart Sensor are first conveyed to a router prior to being delivered to the senor network coordinator. The router resolves collisions in the data delivery and provides to the coordinator a managed delivery of sensor data.

Once the measured physical quantities arrive at the coordinator they are stored 530 in a persistent memory system. The storage of the data is conducted under predetermined policies and procedures. For example, should the available memory on the coordinator become limited, certain types of sensor data may be stored in lieu of other data. Moreover, the time period during which the data is stored may be controlled by the storage policies. The development and application of such storage policies and procedures are well known to one skilled in the relevant art and will not be discussed further.

Once the various physical quantities have been measured by the sensors and sent to the coordinator they remain dormant in compliance with the storage policies of the coordinator until a request is initiated to retrieve a particular packet or set of data. As discussed the coordinator not only possesses the ability to wirelessly communicate with each sensor but also includes a web server which posts a web site on the Internet. According to one embodiment of the present invention, the posted web site of a particular coordinator can offer a list of data available. For example, a coordinator of a temperature gathering sensor array can identity on its web site that it possesses temperature readings throughout a large geographic region between a certain range of dates and times. Perhaps the array in question is a temperature sensing array in Antarctica. Data is collected periodically and based on the data communicated to the coordinator, the coordinator posts that it possesses temperature data on a rolling basis for the past 30 days at hourly intervals at 20 different locations.

A user seeking such information would, through the web site, identify which data entries were desirable for review. According to one embodiment of the present invention, when accessed by a user, the web server embedded in the coordinator would retrieve the requested data from memory and convert 540 it into HTML format pages. Once converted the now HTML format page(s) of data would be posted 550 to the web site for viewing by the user via HTTP and TCP/IP protocols. The viewing of the data would be as simple as logging on to the web site using a common web browser and selecting one or more listed data entries. Since the presentation of the data is via a web site using HTML format pages, there are no proprietary limitations to data access. Neither special apparatus or communication protocols are needed to access the data. Once access is gained to the web site the data is freely available to anyone using a web browser.

FIG. 6 shows a flowchart of a method for accessing data stored at a coordinator of a wireless sensor network according to one embodiment of the present invention. Using a web browser and the Internet or similar wide area network, a user accesses 610 the wireless sensor network coordinator web site. The web site posted by the coordinator can, according to one embodiment, list the various measured physical quantities collected by the sensors and available for viewing. Upon reviewing the list, the user selects and requests 620 additional details regarding one or more measured physical quantities.

The coordinator, upon receiving the request via the web site retrieves 630 the requested measured physical quantity from memory. Recall that the coordinator has previously received a plurality of measured physical quantities from the various sensors in the sensor network and stored them in memory at the coordinator. Once the data has been retrieved, the coordinator then converts 640 the measured quantity into a HTML format page. According to one embodiment of the present invention this conversion can be accomplished by the execution of common gateway interface scripts on the web server. Other means to convert the data into HTML format for posting on the web site are well known to one skilled in the relevant are and are equally applicable and contemplated by the present invention.

With the data now converted to HTML format, the web server of the coordinator communicates 650 the requested measured physical quantity to the user via the web site using a HTML format page. In doing so the user, having only a common web browser, can access any data collected by a sensor and stored on a respective coordinator. This architecture not only enables efficient and reliable access to a variety of sensed data but also enables near real-time collection and dispersal of information to a variety of users. For example, the same collection of data and HTML posting can be simultaneously viewed by a number of users. Indeed a plurality of users can each request and view different measured quantities from the same coordinator. The coordinator is simply responding to the requests and posting the data on its web site in HTML format.

As will be understood by those familiar with the art, the invention may be embodied in other specific forms without departing from the spirit or essential characteristics thereof. Likewise, the particular naming and division of the modules, managers, functions, systems, engines, layers, features, attributes, methodologies, and other aspects are not mandatory or significant, and the mechanisms that implement the invention or its features may have different names, divisions, and/or formats. Furthermore, as will be apparent to one of ordinary skill in the relevant art, the modules, managers, functions, systems, engines, layers, features, attributes, methodologies, and other aspects of the invention can be implemented as software, hardware, firmware, or any combination of the three. Of course, wherever a component of the present invention is implemented as software, the component can be implemented as a script, as a standalone program, as part of a larger program, as a plurality of separate scripts and/or programs, as a statically or dynamically linked library, as a kernel loadable module, as a device driver, and/or in every and any other way known now or in the future to those of skill in the art of computer programming. Additionally, the present invention is in no way limited to implementation in any specific programming language, or for any specific operating system or environment. Accordingly, the disclosure of the present invention is intended to be illustrative, but not limiting, of the scope of the invention, which is set forth in the following claims.

While there have been described above the principles of the present invention in conjunction with monitoring and tracking of wireless sensor networks, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features that are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The Applicant hereby reserves the right to formulate new claims to such features and/or combinations of such features during the prosecution of the present application or of any further application derived therefrom.

We claim:

1. A Smart Sensor system comprising:
at least one sensor operable to measure one or more physical quantities wherein each sensor includes a wireless communication stack operable to wirelessly communicate the one or more physical quantities measured by the at least one sensor; and
a coordinator operable to receive and store the one or more physical quantities measured by the at least one sensor and to convert, in response to receiving a request from a user, the one or more physical quantities measured by the at least one sensor to a HTML web page;

wherein the coordinator includes a web server with a common gateway interface function operable to process common gateway interface scripts so as to dynamically access the one or more physical quantities measured by the at least one sensor; and wherein the user is remote from the at least one sensor.

2. The system of claim 1 wherein a plurality of sensors combine to form a wireless sensor network in communication with the coordinator.

3. The system of claim 2 wherein the coordinator is operable to manage formation of the wireless sensor network.

4. The system of claim 2 wherein each sensor within the wireless sensor network is operable to communicate with each other sensor within the wireless sensor network.

5. The system of claim 1 wherein wireless communication between each sensor and the coordinator is multi-threaded.

6. The system of claim 1 wherein the coordinator includes a wireless communication stack operable for wireless communication with the at least one sensor.

7. The system of claim 1 wherein the coordinator includes a TCP/IP communication stack operable to interface with a network.

8. The system of claim 1 wherein the one or more physical quantities stored in the coordinator is accessible via the coordinator through a web browser.

9. The system of claim 1 further comprising a router interposed between a plurality of sensors and the coordinator wherein the router manages delivery of measured physical quantities from each of the plurality of sensors to the coordinator.

10. A coordinator for a wireless sensor network, the coordinator comprising:
    a wireless communication stack operable to communicate with one or more wireless sensors, each wireless sensor operable to measure one or more physical quantities;
    a network communication stack operable to communicate between a wide area network and the coordinator;
    a memory operable to store measurements of physical quantities received from the one or more wireless sensors;
    a web server having a common gateway interface and operable to convert stored measurements of physical quantities from the one or more wireless sensors into HTML format in response to a request of a user;
    wherein the common gateway interface function is operable to process common gateway interface scripts so as to dynamically access the physical quantities measured by the one or more wireless sensors; and
    wherein the user is remote from the one or more wireless sensors.

11. The coordinator of claim 10 wherein the coordinator manages formation of the wireless sensor network.

12. The coordinator of claim 10 wherein the network communication stack includes TCP/IP protocols.

13. The coordinator of claim 10 wherein physical quantities stored in the memory can be accessed by a web browser via the wide area network.

14. A method for dynamically accessing wireless sensor data, the method comprising:
    accessing a web site of a wireless sensor network coordinator via a web browser;
    requesting a physical quantity measured by a wireless sensor, the wireless sensor being part of a wireless sensor network, the wireless sensor network and the wireless sensor being associated with the wireless sensor network coordinator;
    at the Wireless Sensor Coordinator, accessing the requested physical quantity measured by the wireless sensor;
    converting in response to a request of a user the physical quantity measured by the wireless sensor to a HTML format physical quantity; and
    communicating the HTML format physical quantity to the web browser;
    wherein converting includes processing a common gateway interface script in a web server embedded in the wireless sensor network coordinator; and
    wherein the user is remote from the wireless sensor network.

15. The method of claim 14 further comprising storing the physical quantity measured by the wireless sensor at the wireless sensor network coordinator.

16. The method of claim 14 further comprising conveying the physical quantity measured by the wireless sensor to the wireless sensor network coordinator via a wireless sensor router interposed between each wireless sensor associated with the wireless sensor network and the wireless sensor network coordinator.

17. The method of claim 14 further comprising communicating the HTML format physical quantity to the web browser via a wide area network using TCP/IP protocols.

* * * * *